(12) United States Patent
Choi

(10) Patent No.: US 9,818,986 B2
(45) Date of Patent: Nov. 14, 2017

(54) THIN FILM TRANSISTOR ARRAY STRUCTURE

(71) Applicant: LG DISPLAY CO., LTD., Seoul (KR)

(72) Inventor: IlMan Choi, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/084,182

(22) Filed: Mar. 29, 2016

(65) Prior Publication Data
US 2016/0293639 A1    Oct. 6, 2016

(30) Foreign Application Priority Data

Mar. 31, 2015  (KR) .................. 10-2015-0045018

(51) Int. Cl.
| | | |
|---|---|---|
| H01L 27/12 | (2006.01) | |
| H01L 23/552 | (2006.01) | |
| H01L 51/52 | (2006.01) | |
| G02F 1/1335 | (2006.01) | |
| H01L 27/32 | (2006.01) | |

(52) U.S. Cl.
CPC .... *H01L 51/5281* (2013.01); *G02F 1/133502* (2013.01); *H01L 27/322* (2013.01); *H01L 27/3244* (2013.01); *H01L 51/5284* (2013.01)

(58) Field of Classification Search
CPC ................. H01L 27/1214; H01L 23/552; H01L 127/124
See application file for complete search history.

(56) References Cited

U.S. PATENT DOCUMENTS

| | | | | |
|---|---|---|---|---|
| 2006/0055319 | A1* | 3/2006 | Uemura | H01L 51/5275 313/504 |
| 2006/0262242 | A1* | 11/2006 | Koma | G02F 1/1336 349/69 |
| 2010/0026930 | A1* | 2/2010 | Jepsen | G02B 5/18 349/62 |
| 2015/0001474 | A1* | 1/2015 | Park | H01L 51/5271 257/40 |

* cited by examiner

*Primary Examiner* — Asok K Sarkar
*Assistant Examiner* — Dmitriy Yemelyanov
(74) *Attorney, Agent, or Firm* — Dentons US LLP

(57) ABSTRACT

Disclosed is a TFT array structure including a visibility supplementary layer which is disposed between a TFT and a plate on which the TFT is disposed, for reducing or preventing light from being reflected. The TFT array structure includes a plate having transparency, a TFT substrate facing the plate, and a visibility supplementary layer disposed between the TFT substrate and the plate in a structure covering a portion of the TFT substrate to reduce or prevent an external light from being reflected by a line of the TFT substrate.

23 Claims, 9 Drawing Sheets

THIN FILM TRANSISTOR ARRAY STRUCTURE

This application claims the benefit of Korean Patent Application No. 10-2015-0045018 filed on Mar. 31, 2015, which is hereby incorporated by reference for all purposes as if fully set forth herein.

BACKGROUND

Field of the Invention

The present invention relates to a thin film transistor (TFT) array structure and a display apparatus including the same, and more particularly, to a TFT array structure including a visibility supplementary layer.

Discussion of the Related Art

Recently, an aesthetic factor is importantly evaluated in display apparatuses in the market, along with their performances similar to other information technology (IT) devices and home appliances. Exemplary factors for evaluating performances of display apparatuses are lifetime, lightness, thinness, power consumption being reduced by low voltage driving, realization of color close to reality, fast response time, reduction in viewing angle deviation, high contrast ratio, and/or the like.

In the research, development, and production of display apparatuses, the current market demands performances evaluated from various aspects and flexible designs for various applications. Particularly, visual or tactile distinguishment between a screen of a display apparatus and other peripheral parts is becoming unclear, and thus, display apparatuses and devices equipped with a display apparatus are implemented as one body.

SUMMARY

Accordingly, the present invention is directed to a TFT array structure and a display apparatus including the same and a method of manufacturing the same that substantially obviate one or more problems due to limitations and disadvantages of the related art.

An advantage of the present invention is to provide a display apparatuses with improved visibility and reduced area of an edge of a screen.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, there is provided a thin film transistor (TFT) array structure that includes a plate having transparency, a TFT substrate facing the plate, and a visibility supplementary layer disposed between the TFT substrate and the plate in a structure covering a portion of the TFT substrate to reduce or prevent an external light from being reflected by a line of the TFT substrate.

In another aspect of the present invention, there is provided a display apparatus that includes the TFT array structure, a black matrix layer including at least one hole in correspondence with a lattice shape of the visibility supplementary layer, a light energy adjustment layer disposed between the visibility supplementary layer and the black matrix layer, the light energy adjustment layer being driven by the TFT array structure, and a light source emitting light output to an outside through the visibility supplementary layer, the light source being disposed for a distance from the light source to the black matrix layer to become shorter than a distance from the light source to the visibility supplementary layer. With respect to the plate, the other elements are covered by the visibility supplementary layer, a width of the TFT array structure is greater than a width of each of the other elements, and a space is provided based on a difference between a size of the TFT array structure and a size of each of the other elements, is covered by the visibility supplementary layer, and enables the TFT array structure to be physically fastened to and electrically connected to the other elements.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
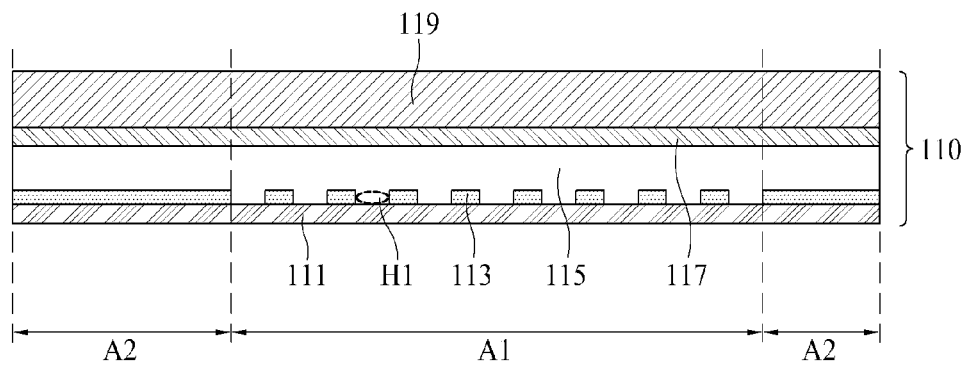
FIG. 1 is a schematic cross-sectional view of a TFT array structure according to an embodiment of the present invention.

Reference will now be made in detail to embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein.

Rather, these embodiments are provided so that this disclosure will be thorough and complete, and will fully convey the scope of the present invention to those skilled in the art. Furthermore, the present invention is only defined by scopes of claims.

A shape, a size, a ratio, an angle, and a number disclosed in the drawings for describing embodiments of the present invention are merely an example, and thus, the present invention is not limited to the illustrated details.

Like reference numerals refer to like elements throughout.

In the following description, when the detailed description of the relevant known technology is determined to unnecessarily obscure the important point of the present invention, the detailed description will be omitted.

In a case where 'comprise', 'have', and 'include' described in the present specification are used, another part may be added unless 'only~' is used.

The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In the present specification, it should be understood that when an element or layer is referred to as being "on" or "connected to" another element or layer, it can be directly on or directly connected to the other element or layer, or intervening elements or layers may be present.

In describing the elements of the present invention, terms such as first, second, A, B, (a), (b), etc., may be used. Such terms are used for merely discriminating the corresponding elements from other elements and the corresponding elements are not limited in their essence, sequence, or precedence by the terms. Therefore, a first element to be described below could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

In the drawings (particularly, cross-sectional views) illustrating various embodiments of the present invention, for convenience, a TFT array structure according to an embodiment of the present invention and elements of a display apparatus including the same are illustrated as having a rectangular shape. The elements are illustrated in order for a front surface to be clearly distinguished from a side surface, but the front surface and the side surface may actually have a gently curved shape without being clearly distinguished from each other.

Hereinafter, a TFT array structure according to an embodiment of the present invention and a display apparatus including the same will be described with reference to the accompanying drawings.

First, a TFT array structure according to an embodiment of the present invention will be described with reference to FIGS. 1 to 5D.

FIG. 1 is a schematic cross-sectional view of a TFT array structure 110 according to an embodiment of the present invention.

Referring to FIG. 1, the TFT array structure 110 according to an embodiment of the present invention may include a visibility supplementary layer 113 disposed on a plate 111, a planarization layer 115 disposed on the visibility supplementary layer 113, an insulation layer 117 disposed on the planarization layer 115, and a TFT substrate 119 disposed on the insulation layer 117. The TFT array structure 110 according to an embodiment of the present invention may include the plate 111, the TFT substrate 119 facing the plate 111, and the visibility supplementary layer 113 which is disposed between the TFT substrate 119 and the plate 111 in a structure covering a portion of the TFT substrate 119 to reduce or prevent an external light from being reflected by a line of the TFT substrate 119.

The plate 111 may be a polymer film or a glass substrate which is very thin in thickness. Alternatively, the plate 111 may be a sacrificial layer after the glass substrate or the polymer film is removed. The plate 111 may be formed of an optically transparent material, and thus, light may pass through the plate 111.

The plate 111 may include a plane which has a polygonal shape including a tetragonal shape or a circular shape including an elliptical shape. The plate 111 may include a side surface which is flat or curved in shape. Alternatively, the plate 111 may be flexible and thus may be bent from a flat state and then may restore to an original state, may be unfolded from a bent state to a flat state and then may restore to the original state, or may be bent in an arbitrary shape and may be fixed in the arbitrary shape. Alternatively, the plate 111 may be rolled to have a certain curvature radius and then may be unrolled. A size of each of the elements of the TFT array structure 110 may not be greater than that of the plate 111.

The plate 111 may be divided into a first area A1 and a second area A2. The TFT substrate 119 to be described below may include a TFT array which is disposed to correspond to the first area A1 of the plate 111. In other words, the first area A1 of the plate 111 may be provided in correspondence with an area where the TFT array included in the TFT substrate 119 to be described below is disposed. The second area A2 may be a peripheral area of the first area A1 and may be provided in a shape surrounding a portion or a whole portion of the first area A1.

The visibility supplementary layer 113 may be disposed on the plate 111. The visibility supplementary layer 113 may be disposed between the plate 111 having transparency and the TFT substrate 119 before the TFT substrate 119 to be described below is disposed on the plate 111. In other words, when seen with respect to the plate 111, the TFT substrate 119 and the visibility supplementary layer 113 may be disposed on the plate 111 in order for the visibility supplementary layer 113 to have a shape which covers various lines of the TFT substrate 119 in order to hide the various lines. As a result, a degree to which an external light incident through the plate 111 having transparency is again reflected is reduced or minimized by the various lines which have light reflectivity and configure the TFT substrate 119.

The visibility supplementary layer 113 may primarily block an incident path of an external light in front of the lines in order for the external light not to be incident on the various lines of the TFT substrate 119. Although the visibility supplementary layer 113 may not block an incident path of the external light entering through the sides of the lines, the visibility supplementary layer 113 may block an output path of the light reflected by the lines. That is, even when there is an external light reflected by the line, the visibility supplementary layer 113 may secondarily block an output path of such a reflected external light. In other words, the visibility supplementary layer 113 serves as a shade for the various lines of the TFT substrate 119 on the viewer-side of the plate 111.

Particularly, other elements which are disposed behind the visibility supplementary layer 113 with respect to the plate 111 may not be exposed by the visibility supplementary layer 113. As a result, an aesthetic appearance of one surface of the plate 111 may be enhanced, and one surface of the plate 111 may be exposed to users which are using a finished product, whereby the finished product is more innovatively and freely designed.

Still referring to FIG. 1, the visibility supplementary layer 113 may include at least one first hole H1 corresponding to the TFT array of the TFT substrate 119 to be described below. For example, the first hole H1 may be disposed in the visibility supplementary layer 113 according to an arrangement rule of the TFT array. In this case, the first hole H1 may be disposed in the visibility supplementary layer 113 not to overlap a TFT of the TFT array of the TFT substrate 119. The first hole H1 may have a shape piercing the visibility supplementary layer 113 and may expose the plate 111.

Moreover, although not illustrated in FIG. 1, the visibility supplementary layer 113 may include at least one second hole (not shown) corresponding to a pad part PAD extending from the TFT array included in the TFT substrate 119 to be described below. For example, the second hole (not shown) may be disposed in the visibility supplementary layer 113 according to an arrangement rule of at least one pad part (not shown) which is disposed to correspond to the second area A2 extending from the TFT array. In this case, the second hole (not shown) may be disposed in the visibility supplementary layer 113 in a structure overlapping a portion or a whole portion of the pad part (not shown).

Hereinafter, a shape of the visibility supplementary layer 113 and a shape of the first hole H1 will be described in more detail with reference to FIGS. 2A and 2B.

Figure 2A:
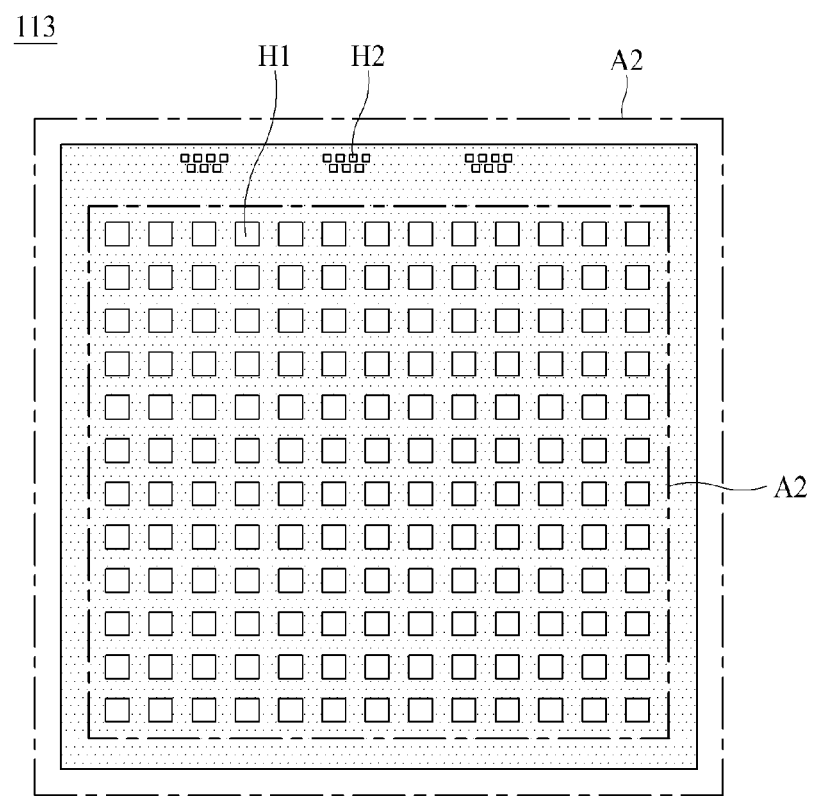
FIGS. 2A and 2B are plan views of a visibility supplementary layer included in the TFT array structure of FIG. 1.
Figure 2B:
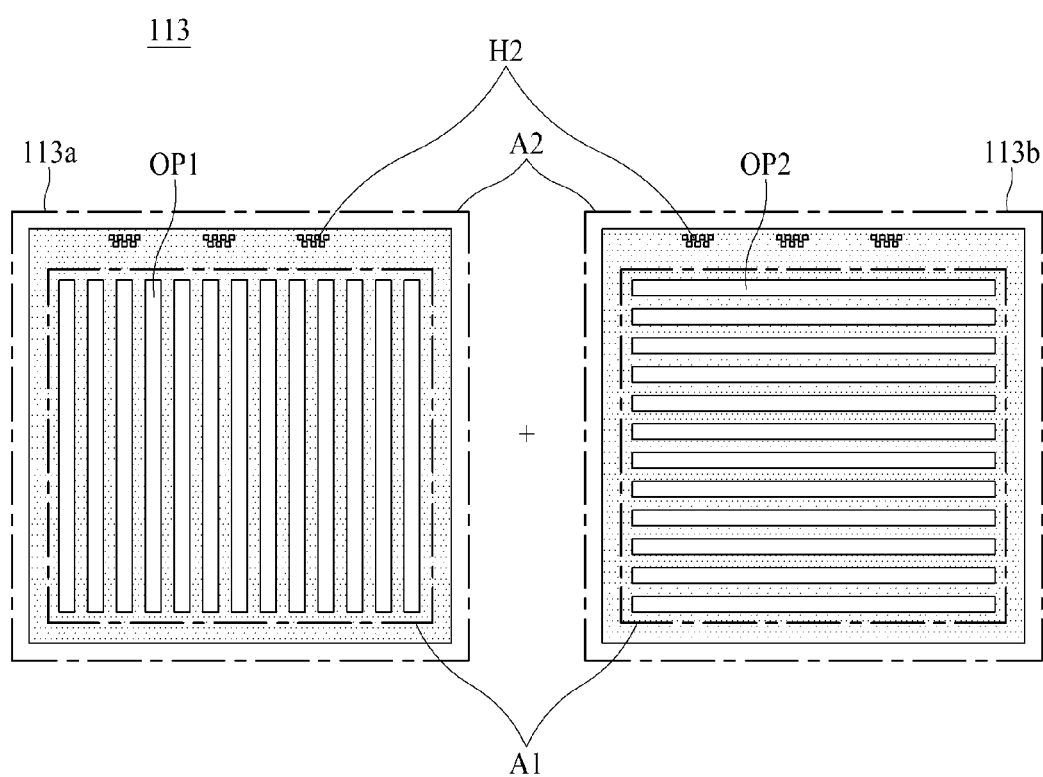

FIGS. 2A and 2B are plan views of the visibility supplementary layer 113 included in the TFT array structure 110 of FIG. 1.

As illustrated in FIG. 2A, the at least one hole H1 may be repeatedly disposed in the visibility supplementary layer 113 according to a rule. As a result, the visibility supplementary layer 113 may have a shape corresponding to the first area A1 of the plate 111. That is, since the at least one hole H1 is repeatedly disposed in correspondence with the first area A1 of the plate 111, the visibility supplementary layer 113 may have a lattice shape.

Moreover, at least one hole H2 may be disposed in the visibility supplementary layer 113. Similarly to the first hole H1, the second hole H2 may be formed to expose the plate 111 by piercing the visibility supplementary layer 113. However, unlike the first hole H1, since the second hole H2 is disposed in correspondence with the second area A2 of the plate 111, the second hole H2 may be formed irrespective of that the visibility supplementary layer 113 has a lattice shape in correspondence with the first area A1. That is, the at least one hole H2 may be irregularly disposed, repeatedly disposed in a zigzag shape, or disposed to be partially concentrated in only a certain area. Nevertheless, the second hole H2 may have a shape corresponding to a pat part (not shown). The number of the second holes H2 disposed in the TFT array structure 110 according to an embodiment of the present invention may be smaller than the number of the first holes H1, and a size of the second hole H2 may be equal to or less than that of the first hole H1.

Although not illustrated in FIG. 2A, a conductive line (not illustrated) to be described below with reference to FIG. 5 may be further provided on the visibility supplementary layer 113. In more detail, the TFT array structure 110 according to an embodiment of the present invention may further include the conductive line (not illustrated) which is disposed to directly contact the visibility supplementary layer 113 without overlapping the first hole H1. For example, the conductive line (not illustrated) may be disposed in a lattice shape to overlap the visibility supplementary layer 113. In this case, a width of the conductive line (not illustrated) may be less than that of the visibility supplementary layer 113. Here, the width of the visibility supplementary layer 113 denotes a distance between adjacent first holes H1.

As illustrated in FIG. 2B, the at least hole H1 may be disposed in the visibility supplementary layer 113 through overlap between a first visibility supplementary layer 113a and a second visibility supplementary layer 113b. As a result, the visibility supplementary layer 113 may have a lattice shape corresponding to the first area A1 of the plate 111. That is, since the at least one first hole H1 is repeatedly disposed in correspondence with the first area A1 of the plate 111, the visibility supplementary layer 113 may have a lattice shape. The first visibility supplementary layer 113a and the second visibility supplementary layer 113b will be described below in more detail.

As illustrated in FIG. 2B, the visibility supplementary layer 113 may include the first visibility supplementary layer 113a, which is provided to have a first opening OP1 having a stripe shape in one axis direction, and the second visibility supplementary layer 113b which is provided to have a second opening OP2 having a stripe shape in a direction intersecting the one axis direction, wherein the first visibility supplementary layer 113a may overlap the second visibility supplementary layer 113b. The at least one hole H1 may be provided in the visibility supplementary layer 113 through an intersection of the first opening OP1 and the second opening OP2. Simultaneously, the first visibility supplementary layer 113a may overlap the second visibility supplementary layer 113b in order for a position of a second hole H2 of the first visibility supplementary layer 113a to match a position of a second hole H2 of the second visibility supplementary layer 113b, and thus, the second hole H2 as well as the first hole H1 may be provided in the visibility supplementary layer 113. As a result, the visibility supplementary layer 113 may include a portion where the first visibility supplementary layer 113a overlaps the second visibility supplementary layer 113b, a portion where only the first visibility supplementary layer 113a is disposed, and a portion where only the second visibility supplementary layer 113b is disposed. For this reason, a thickness may not be uniform.

Although not illustrated in FIG. 2B, a conductive line (not illustrated) to be described below with reference to FIG. 5 may be further provided between the first visibility supplementary layer 113a and the second visibility supplementary layer 113b which configure the visibility supplementary layer 113. In more detail, the TFT array structure 110 according to an embodiment of the present invention may further include the conductive line (not illustrated) which is disposed to directly contact the visibility supplementary layer 113 without overlapping the first hole H1. For example, the conductive line (not illustrated) parallel with the first opening OP1 may be disposed in a stripe shape to overlap the first visibility supplementary layer 113a, and then, the second visibility supplementary layer 113b may be disposed to overlap the first visibility supplementary layer 113a on which the conductive line (not illustrated) is disposed. The conductive line (not illustrated) may include a portion overlapping the first visibility supplementary layer 113a and the second visibility supplementary layer 113b and a portion overlapping only the first visibility supplementary layer 113a. In other words, the conductive line (not illustrated) may include a portion sandwiched by the first visibility supplementary layer 113a and the second visibility supplementary layer 113b and a portion which overlaps the first visibility supplementary layer 113a but does not overlap the second visibility supplementary layer 113b.

In other words, a width of the conductive line (not illustrated) may be less than that of the visibility supplementary layer 113, and the conductive line (not shown) may include a portion sandwiched by the visibility supplementary layer 113. In this case, a portion of the conductive line (not illustrated) sandwiched by the visibility supplementary layer 113 may correspond to a whole area of the conductive line (not illustrated) or may be a partial area which is repeated. Here, the width of the visibility supplementary layer 113 denotes a distance between adjacent first holes H1.

The visibility supplementary layer 113 provided through an overlap between the first visibility supplementary layer 113a and the second visibility supplementary layer 113b in FIG. 2B has the same plan view as that of the visibility supplementary layer 113 of FIG. 2A. However, a thickness of the visibility supplementary layer 113 of FIG. 2B may be wholly uniform because there is a portion where the first visibility supplementary layer 113a does not overlap the second visibility supplementary layer 113b. Accordingly, the visibility supplementary layer 113 included in the TFT array structure 110 according to an embodiment of the present invention may have a uniform thickness in a whole area thereof or may not be uniform in thickness.

Hereinafter, a shape of the second hole H2 will be described in more detail with reference to FIGS. 3A to 3C and 4.

Figure 3A:
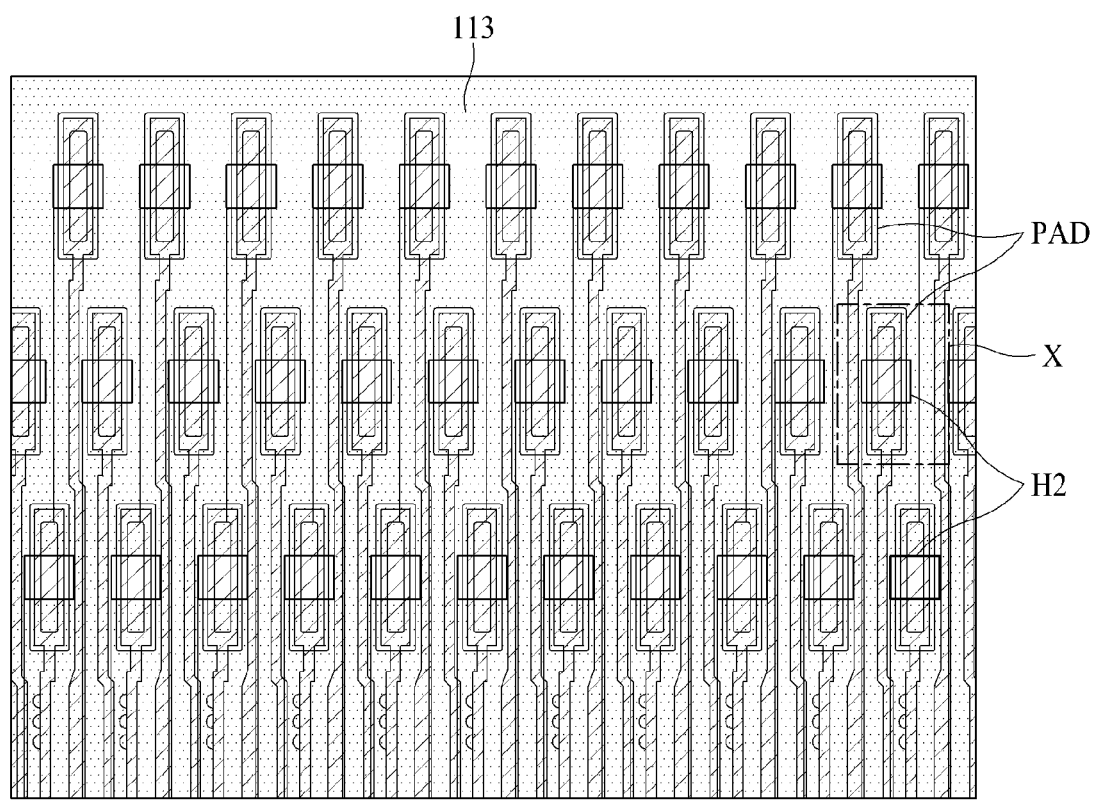
FIG. 3A is a plan view illustrating a pad part extending from a TFT array included in the TFT array structure of FIG. 1, a second hole, and a visibility supplementary layer which overlap each other.

FIG. 3A is a plan view illustrating the pad part PAD extending from the TFT array included in the TFT array structure 110 of FIG. 1, the second hole H2, and the visibility supplementary layer 113 which overlap each other.

FIG. 3A illustrates a state where the pad part PAD, where a chip-type driving integrated circuit (IC) is directly and electrically connected to a backside, overlaps the visibility supplementary layer 113 including the at least one second hole H2 exposing a portion of the pad part PAD. The driving IC receiving a driving signal from the outside may output a converted driving signal to a plurality of data pad parts PAD, and the converted driving signal may be supplied to the TFT array through a plurality of data lines. Alternatively, the driving IC receiving the driving signal from the outside may output the converted driving signal to a plurality of gate pad parts PAD, and the converted driving signal may be supplied to the TFT array through a plurality of gate lines. In this case, each of the lines may be connected to the chip-type driving IC through a corresponding pad part PAD. In more detail, each of the lines may be directly and electrically connected to the chip-type driving IC through a surface opposite to one surface of a corresponding pad part PAD facing the second hole H2. When expressed with respect to the second hole H2, a surface opposite to one surface of each of the pad parts PAD connected to the chip-type driving IC may be partially or wholly exposed by the second hole H2.

Figure 3B:
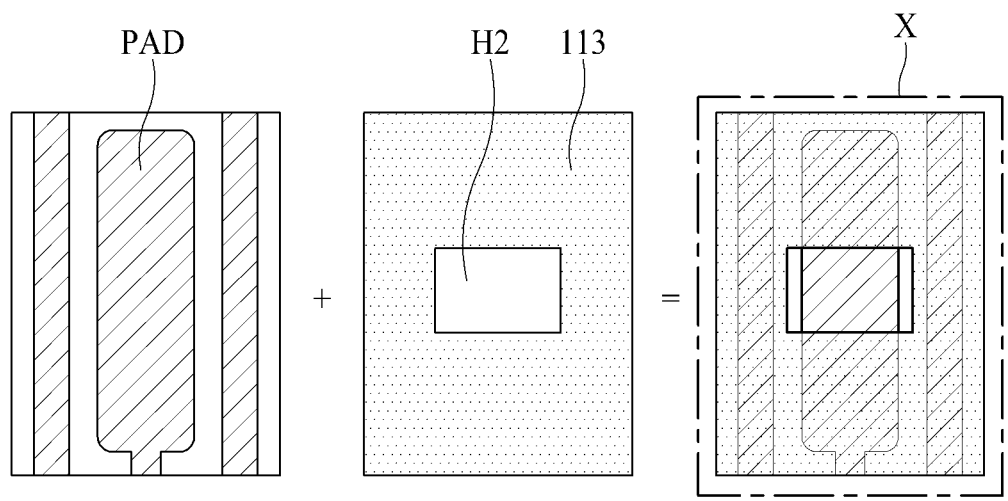
FIGS. 3B and 3C are enlarged views of a portion X of FIG. 3A and separately illustrate a plan view of the pad part and a plan view of the visibility supplementary layer including the second hole.

FIG. 3B is an enlarged view of a portion X of FIG. 3A and separately illustrates a plan view of the pad part PAD and a plan view of the visibility supplementary layer 113 including the second hole H2. An operation where the portion X is formed through overlap between the pad part PAD and the visibility supplementary layer 113 will be described below with reference to FIG. 3B.

As illustrated in FIG. 3B, the second hole H2 of the visibility supplementary layer 113 may be disposed to partially overlap the pad part PAD extending from the TFT array of the TFT substrate 119. In this case, the pad part PAD may include a plurality of data pad parts PAD which extend from a plurality of data lines included in the TFT array and are disposed in correspondence with the second area A2. Alternatively, the pad part PAD may include a plurality of gate pad parts PAD which extend from a plurality of gate lines included in the TFT array and are disposed in correspondence with the second area A2. In this case, a size of the second hole H2 is illustrated as being less than that of the pad part PAD, but is not limited thereto.

Figure 3C:
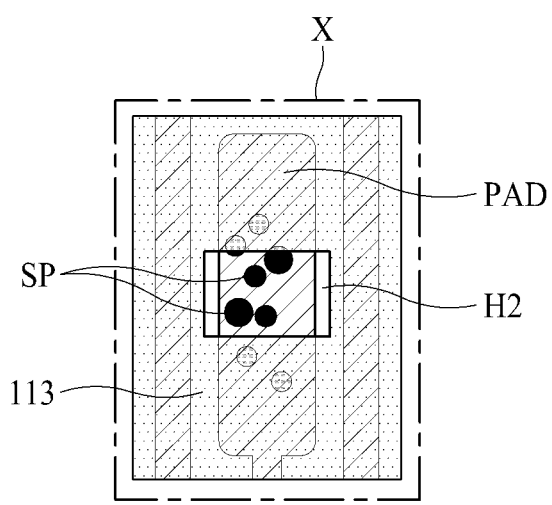

FIG. 3C is an enlarged view of the portion X of FIG. 3A and is a view schematically illustrating an indentation SP of the pad part PAD, exposed through the second hole H2 facing the pad part PAD, in a spot shape. In this case, the indentation SP may be an indentation SP, caused by a conductive ball, of an anisotropic conductive film between the pad part PAD and the chip-type driving IC.

In more detail, the anisotropic conductive film including the conductive ball may be disposed between the pad part PAD and the chip-type driving IC in order for the pad part PAD to be directly and electrically connected to the chip-type driving IC. In this case, a physical pressurization test process may be performed at an attachment position in order to check whether the pad part PAD is well connected to the chip-type driving IC. At this time, the indentation SP caused by the conductive ball may be formed at the attachment position. The physical pressurization test process corresponding to the attachment position may be performed for one surface of the pad part PAD facing the chip-type driving IC, and thus, the indentation SP may be formed as a protruding spot in a surface opposite to one surface of the pad part PAD connected to the chip-type driving IC.

The indentation SP may be observed through the second hole H2 which partially or wholly exposes the surface opposite to the one surface of the pad part PAD connected to the chip-type driving IC. That is, the pad part PAD may include the indentation SP, and the indentation SP may be exposed in an area where the pad part PAD overlaps the second hole H2. In order for the indentation SP to be effectively observed, the second hole H2 may overlap a center of the pad part PAD.

As described above, the visibility supplementary layer 113 may include the at least one second hole H2 based on the driving IC being attached to the TFT substrate 119. In other words, the visibility supplementary layer 113 may include the at least one second hole H2 which is formed to check whether the driving IC is attached to the TFT substrate 119 in correspondence with the second area A2. To this end, the TFT substrate 119 may include the at least one pad part PAD which extends from the TFT array and includes the indentation SP, and the second hole H2 of the visibility supplementary layer 113 may be disposed in a structure exposing the indentation SP of the pad part PAD. With respect to the plate 111, the indentation SP of the pad part PAD may be observed through the second hole H2, and thus, whether the driving IC is attached to the pad part PAD may be easily checked.

Figure 4:
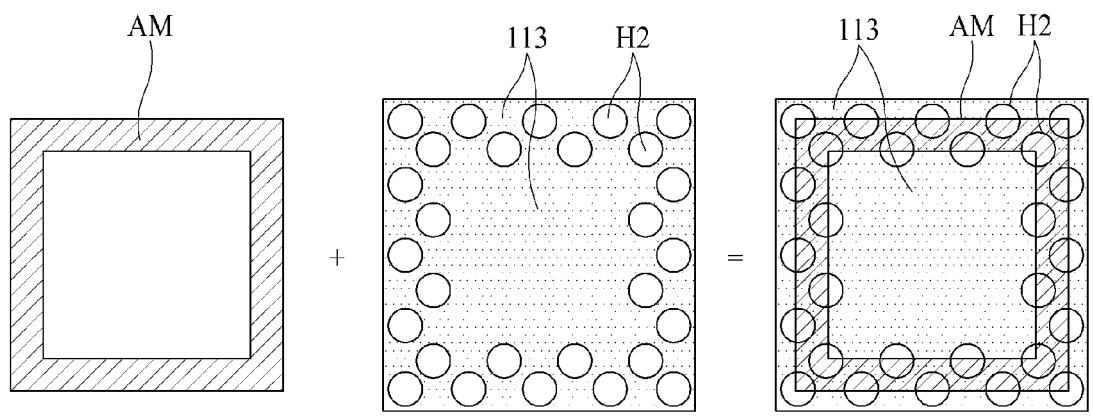
FIG. 4 separately illustrates a plan view of an align mark, a plan view of the visibility supplementary layer including the second hole, and a plan view of when the align mark, the second hole, and the visibility supplementary layer overlap each other.

FIG. 4 separately illustrates a plan view of an align mark AM, a plan view of the visibility supplementary layer 113 including the second hole H2, and a plan view of when the align mark AM, the second hole H2, and the visibility supplementary layer 113 overlap each other. An operation where an overlap portion of the align mark AM and the second hole H2 is formed through overlap between the align mark AM and the visibility supplementary layer 113 will be described below with reference to FIG. 4.

The align mark AM may be disposed on the TFT substrate 119 in correspondence with the second area A2. In this case, the align mark AM may be formed of the same material as a material included in the TFT array. For example, the align mark AM may be formed of the same material as a material forming a gate line in a process of forming the gate line of the TFT array. The align mark AM may have a polygonal or circular ring shape, a cross shape, or a polygonal or circular shape in addition to a tetragonal ring shape illustrated in FIG. 4. Furthermore, a shape of the align mark AM may be formed by a combination of various shapes such as a shape where a tetragonal shape smaller than a tetragonal ring is disposed in the tetragonal ring to be spaced apart from the tetragonal ring.

As illustrated in FIG. 4, the second hole H2 of the visibility supplementary layer 113 may be disposed to partially expose an edge of the align mark AM. For example, the second hole H2 may be disposed to form a spot shape corresponding to a vertex of the align mark AM in order for a vertex of the align mark AM to be exposed. That is, the second hole H2 may be disposed to expose corners of the align mark AM. Alternatively, the second hole H2 may be disposed to form a dotted-line shape along an edge of the align mark AM in order for the edge of the align mark AM to be successively exposed at certain intervals. In this case, the second hole H2 may be implemented in a dotted-line shape having an intermittent or repeated shape, and thus, the second hole H2 and the align mark AM may be effectively aligned substantially without any increase in width of a pierced area. That is, although the second hole H2 has a small size, an align effect is increased or maximized by the small-size second hole H2. Accordingly, a light leakage caused by the second hole H2 is reduced or minimized in the second area A2.

As described above, the visibility supplementary layer 113 may include the at least one second hole H2 for alignment with the align mark AM of the TFT substrate 119 in correspondence with the second area A2. In other words, the visibility supplementary layer 113 may include the at least one second hole H2, which is provided to be aligned with the align mark AM of the TFT substrate 119, in correspondence with the second area A2.

Also, the visibility supplementary layer 113 may be disposed between the plate 111 having transparency and the TFT substrate 119. As a result, an external light incident through the plate 111 having transparency may be again reflected by various lines which have light reflectivity and configure the TFT substrate 119, thereby reducing or minimizing a degree to which visibility is reduced. To this end, the visibility supplementary layer 113 may have a thickness of 4,500 Å or less and may have an optical density of 1 μm or more.

In an operation where the visibility supplementary layer 113 is disposed between the plate 111 and the TFT substrate 119, before the TFT substrate 119 is disposed on the plate 111 in CASE 1, the visibility supplementary layer 113 may be disposed on the plate 111 prior to the TFT substrate 119, or after the visibility supplementary layer 113 is disposed on the TFT substrate 119 in CASE 2, the plate 111 may be disposed on the visibility supplementary layer 113.

In CASE 1, the TFT substrate 119 may be disposed on the plate 111 on which the visibility supplementary layer 113 is disposed, and thus, the visibility supplementary layer 113 may have a structure and physical properties for physically and chemically enduring a process of forming the TFT substrate 119. That is, the visibility supplementary layer 113 may be formed of a material having characteristic necessary for a high temperature condition in a process of forming the TFT of the TFT array included in the TFT substrate 119.

A process condition, which the visibility supplementary layer 113 should physically and chemically endure, for forming the TFT substrate 119 will be described below in detail. Various inorganic layers included in the TFT configuring the TFT array may be formed through a deposition process which is performed at a high temperature of at least 150 degrees C. or more, for example, a high temperature of 350 degrees C.

In more detail, when the TFT is an oxide TFT, a process of crystallizing a portion or a whole portion of an active semiconductor may be performed through an annealing process of thermally treating the active semiconductor at a high temperature of about 400 degrees C. to about 700 degrees C. As a result, reliability of a threshold voltage based on a bias temperature stress (BTS) of the oxide TFT may be improved.

Moreover, when the TFT is a low temperature poly-silicon TFT, a high temperature process is used to form the low temperature poly-silicon TFT. A process of depositing an inorganic layer including an active semiconductor may be performed at about 350 degrees C. Subsequently, a dehydrogenation process may be performed at about 400 degrees C. to about 500 degrees C., a process of crystallizing amorphous silicon may be performed at a maximum of 700 degrees C., and an activation process of repairing a damage of a device may be performed at about 500 degrees C. to about 600 degrees C. after doping.

The visibility supplementary layer 113 may include a material which has heat resistance and light-blocking properties and is not modified, sublimated, or burned in an environment for forming the TFT substrate 119, based on a process of forming the TFT substrate 119 at a high temperature of at least 350 degrees C. Here, heat resistance denotes that a glass transition temperature (Tg) is high. Particularly, a material having a considerably high weight ratio among materials included in the visibility supplementary layer 113 may be a polymer binder, and the polymer binder may include a material having a glass transition temperature higher than a process temperature for forming the TFT substrate 119. As a result, an incidence of outgassing of the visibility supplementary layer 113 is reduced or minimized in a process of forming the TFT substrate 119. The visibility supplementary layer 113 reduces or prevents an external light from being reflected from various lines included in the TFT array and may not be changed in shape and properties even after a process of forming the TFT substrate 119.

The visibility supplementary layer 113 may absorb light incident on the visibility supplementary layer 113 to block the light. Since the visibility supplementary layer 113 blocks light by absorbing the light and includes a hole having a pierced shape, the visibility supplementary layer 113 may provide a traveling path of the light. In this case, a light-absorbing material may be a material capable of being patterned by a photolithography process, and for example, may be a photosensitive material such as a photoinitiator. The material capable of being patterned by a photolithography process may include one or more of a black carbon pigment, a graphene oxide-based pigment, a graphite oxide-based pigment, a chromium-based pigment, a titanium-based pigment, and an organic color pigment, a binder polymer fixing a connection between pigments, a light cross-linking agent connecting pigments, and a photoinitiatior and an additive for adding viscosity. Here, the polymer binder may include one or more of a siloxane-based binder, a silanzane-based binder, and a polyimide-based binder.

Alternatively, the light-absorbing material may be a material capable of being patterned by a dry etching process or a wet etching process. The material capable of being patterned by the etching process may include metal oxide and metal alloy oxide having non-photosensitivity and low reflectivity. For example, the metal oxide and metal alloy oxide having non-photosensitivity and low reflectivity may include at least one of copper oxide (CuO), manganese oxide (MnO), copper manganese alloy oxide (CuMnO), silver oxide(AgO), and zinc oxide (ZnO). A material capable of being patterned by another etching process may be a combination of materials having a combination of refractive indexes for achieving the destructive interference of reflected light. The combination of the materials may be, for example, a combination of molybdenum (Mo)-indium tin oxide (ITO)-copper (Cu). A material capable of being patterned by another etching process may be a composition of titanium-based pigment and non-photosensitive polyimide.

In CASE 2, the plate 111 may be disposed on the TFT substrate 119 on which the visibility supplementary layer 113 is disposed, and thus, an adhesive film (not illustrated) or an adhesive resin curing material (not illustrated) which is optically clear and transparent may be disposed between the visibility supplementary layer 113 and the plate 111. The adhesive film (not illustrated) or the adhesive resin curing material (not illustrated) may need a curing process performed at a high temperature, in order for the visibility supplementary layer 113 to be adhered to the plate 111. As a result, in a process where the plate 111 is disposed on the TFT substrate 119 on which the visibility supplementary layer 113 is disposed, the visibility supplementary layer 113 may have a structure and physical properties for physically and chemically enduring a process of forming the adhesive film (not illustrated) or the adhesive resin curing material (not illustrated).

As described above, the TFT array structure 110 according to an embodiment of the present invention may be disposed between the plate 111 and the TFT substrate 119 and may include the visibility supplementary layer 113 formed of a material having heat resistance and light-blocking properties. Also, the visibility supplementary layer 113 may include the at least one first hole H1 corresponding to the TFT array and the at least one second hole H2 corresponding to the pad part PAD or the align mark AM.

Referring back to FIG. 1, the planarization layer 15 may be disposed on the visibility supplementary layer 113. Since the visibility supplementary layer 113 includes the first hole H1 and the second hole H2, the visibility supplementary layer 113 may have a stepped portion. The planarization layer 115 may cover a step height of the visibility supplementary layer 113. A flat surface of the planarization layer 115 may face the TFT substrate 119 to be described below. The planarization layer 115 may be disposed to correspond to a whole portion of each of the first and second areas A1 and A2 of the plate 111. Similarly to the plate 111, the planarization layer 115 may have transparency. Also, the planarization layer 115 may be disposed between the visibility supplementary layer 113 and the TFT substrate 119.

Similarly to the visibility supplementary layer 113, the planarization layer 115 may have a structure and physical properties for physically and chemically enduring the process of forming the TFT substrate 119. Alternatively, the planarization layer 115 may have a structure and physical properties for physically and chemically enduring the process of forming the adhesive film (not illustrated) or the adhesive resin curing material (not illustrated).

The insulation layer 117 may be disposed on the planarization layer 115. The insulation layer 117 may be disposed to cover the visibility supplementary layer 113, and thus, the insulation layer 117 may be formed of a transparent material. The insulation layer 117 may act as a protective layer that prevents damage from occurring in the planarization layer 115 due to a process of forming the TFT substrate 119 on the planarization layer 115. Various elements of the TFT substrate 119 may be disposed on the insulation layer 117, and thus, the insulation layer 117 may be formed of an insulating material. Particularly, the insulation layer 117 may be formed of a material having a permittivity lower than that of the visibility supplementary layer 113. The insulation layer 117 having a low permittivity may be disposed between the TFT substrate 119 and the visibility supplementary layer 113, thereby minimizing the incidence of occurrence of an undesired capacitance caused by a black matrix 113 which is high in heat resistance. A thickness of the insulation layer 117 may be at least 3,000 Å for decreasing the incidence of occurrence of an undesired capacitance. Also, in order to help the plate 111 to reduce or prevent water from penetrating into the display apparatus, the insulation layer 117 may be a high-density anti-moisture layer having a low water vapor transmission rate (WVTR). For example, the insulation layer 117 may be thinner in thickness than the planarization layer 115, and a WVTR value of the insulation layer 117 may be lower than that of the planarization layer 115. The insulation layer 117 having transparency, insulating properties, low permittivity, and a low WVTR may include an insulating inorganic material, which enables the insulation layer 117 to be formed to have good stiffness and a thin thickness, such as silicon oxide ($Si_xO_y$), aluminum oxide ($Al_xO_y$), silicon nitride ($Si_xN_y$), aluminum nitride ($Al_xN_y$), silicon oxynitride ($Si_xO_yN_z$), aluminum oxynitride ($Al_xO_yN_z$), and/or the like.

The TFT substrate 119 may be disposed on the insulation layer 117. The TFT substrate 119 may include the TFT array which is disposed in correspondence with the first area A1. In this case, the TFT array may include a plurality of gate lines and a plurality of data lines which intersect each other, include a plurality of gate electrodes respectively extending from the plurality of gate lines and a plurality of data electrodes respectively extending from the plurality of data lines, and have a structure where a plurality of TFTs each including a corresponding electrode are arranged according to a certain rule. The TFT array may include a plurality of switching TFTs. Alternatively, the TFT array may include a plurality of TFTs for driving a polarizer to adjust the amount of light. Alternatively, the TFT array may include a plurality of TFTs for driving a light source to emit light. Alternatively, the TFT array may include a plurality of TFTs for driving the light source and adjusting the amount of light emitted from the light source.

The TFT substrate 119, as illustrated in FIGS. 3A to 3C, may include the at least one pad part PAD which is disposed in correspondence with the second area A2. In this case, the pad part PAD may be an end area of a gate line or a data line extending to the second area A2 and may be an area for receiving an electrical driving signal and power. The TFT substrate 119 may be electrically connected to the driving IC through the pad part PAD and may receive the electrical driving signal and the power from the driving IC.

The TFT substrate 119, as illustrated in FIG. 4, may include the at least one align mark AM which is disposed in correspondence with the second area A2. The align mark AM may be disposed on the TFT substrate 119 in correspondence with the second area A2. In this case, the align mark AM may be formed of the same material as a material included in the TFT array. For example, the align mark AM may be formed of the same material as a material forming a gate line in a process of forming the gate line of the TFT array. The align mark AM may have a polygonal or circular ring shape, a cross shape, or a polygonal or circular shape in addition to a tetragonal ring shape illustrated in FIG. 4. Furthermore, a shape of the align mark AM may be formed by a combination of various shapes such as a shape where a tetragonal shape smaller than a tetragonal ring is disposed in the tetragonal ring to be spaced apart from the tetragonal ring.

Although not illustrated in FIG. 1, the TFT array structure 110 according to an embodiment of the present invention may further include a conductive line (not illustrated) which is disposed between the visibility supplementary layer 113 and the TFT substrate 119 along a shape of the visibility supplementary layer 113. That is, the TFT array structure 110 may further include a conductive line (not illustrated) that directly contacts the lattice 113, is covered by the visibility supplementary layer 113, has a width less than that of the visibility supplementary layer 113, and is disposed to have a lattice shape or a stripe shape identically to a shape of the visibility supplementary layer 113. Here, the width of the visibility supplementary layer 113 denotes a distance between adjacent first holes H1. Although not illustrated in FIG. 1, the conductive line (not illustrated) may be disposed in order for the insulation layer 117 to be disposed between the TFT substrate 119 and the conductive line, and may be electrically connected to the source electrode or drain electrode of the TFT through a hole which is formed in each of the TFT substrate 119 and the insulation layer 117. The conductive line (not illustrated) may be formed of metal or a metal alloy which is opaque and is low in resistance, and may be disposed to be electrically connected to one terminal of the TFT of the TFT substrate 119 and to be spaced apart from the TFT array.

Hereinafter, a shape of a conductive line disposed between the visibility supplementary layer 113 and the TFT substrate 119 will be described in more detail with reference to FIGS. 5A to 5C.

FIGS. 5A to 5D are partially enlarged cross-sectional views of a cross-sectional surface of the TFT array structure 110 illustrated in FIG. 1.

Figure 5A:
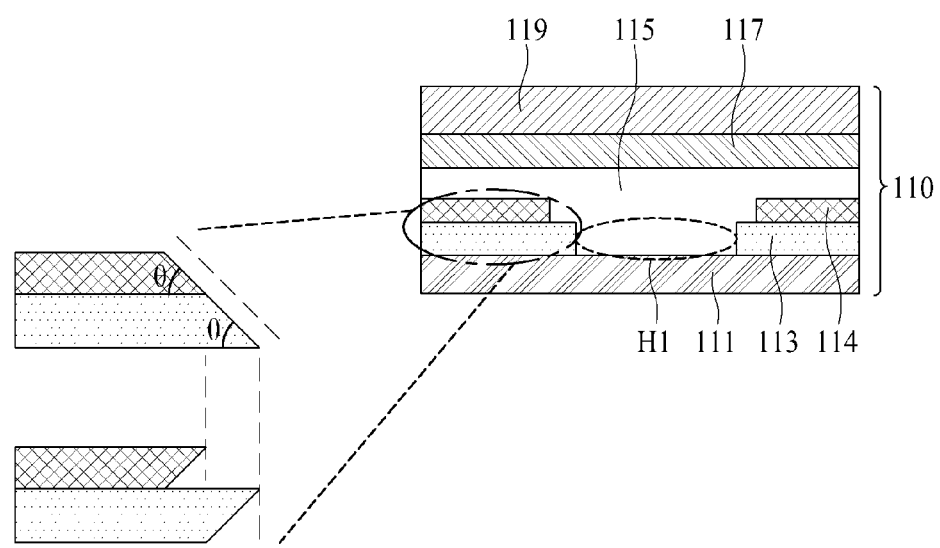
FIGS. 5A to 5D are partially enlarged cross-sectional views of a cross-sectional surface of the TFT array structure illustrated in FIG. 1.

As illustrated in FIG. 5A, a conductive line 114 may be disposed between the visibility supplementary layer 113 and the planarization layer 115. In other words, the conductive line 114 may be disposed on the visibility supplementary layer 113. In more detail, the conductive line 114 and the visibility supplementary layer 113 may overlap each other without any element being disposed therebetween. With respect to the plate 111, since the conductive line 114 is beneficially covered by the visibility supplementary layer 113, a width of the conductive line 114 may be equal to or less than that of the visibility supplementary layer 113. Here, the width of the visibility supplementary layer 113 denotes a distance between adjacent first holes H1. The width of the conductive line 114 may be equal to or less than that of the visibility supplementary layer 113 irrespective of an order where the conductive line 114 and the visibility supplementary layer 113 are patterned and whether a shape of an edge of each of the conductive line 114 and the visibility supplementary layer 113 is a taper shape or an reverse taper shape. Nevertheless, for example, a case where the conductive line 114 and the visibility supplementary layer 113 are patterned together may be considered. In this case, the conductive line 114 may have a taper shape where the edge of the conductive line 114 and the edge of the visibility supplementary layer 113 have similar angles "Θ" and a long with of the conductive line 114 matches a short width of the visibility supplementary layer 113.

Figure 5B:
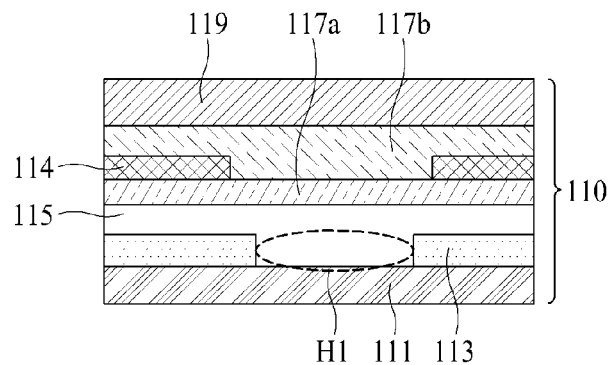

As illustrated in FIG. 5B, the conductive line 114 may be disposed to have a structure sandwiched by the insulation layer 117. In more detail, a first insulation layer 117a may be disposed on the planarization layer 115, the conductive line 114 may be disposed on the first insulation layer 117a to overlap the visibility supplementary layer 113, and a second insulation layer 117b may be disposed on the conductive line 114, whereby the conductive line 114 may be disposed in a structure sandwiched by the first insulation layer 117a and the second insulation layer 117b. In this case, a material forming the first insulation layer 117a may be the same as a material forming the second insulation layer 117b.

Figure 5C:
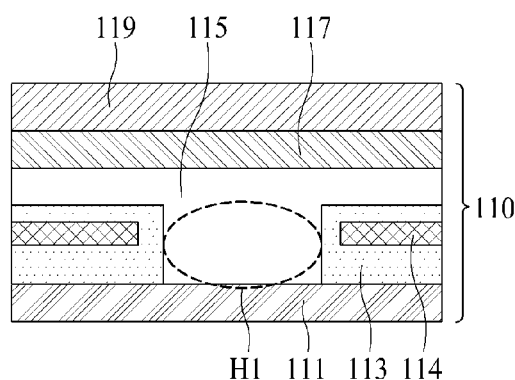

As illustrated in FIG. 5C, the conductive line 114 may be disposed to have a structure sandwiched by the visibility supplementary layer 113. In more detail, the first visibility supplementary layer 113a may be disposed on the plate 111, the conductive line 114 may be disposed on the first visibility supplementary layer 113a to overlap the first visibility supplementary layer 113a, and the second visibility supplementary layer 113b may be disposed on the conductive line 114, whereby the conductive line 114 may be disposed in a structure sandwiched by the first visibility supplementary layer 113a and the second visibility supplementary layer 113b. In this case, a material forming the first visibility supplementary layer 113a may be the same as a material forming the second visibility supplementary layer 113b. In this case, the first visibility supplementary layer 113a and the second visibility supplementary layer 113b may each have a structure illustrated in FIG. 2A, have a stripe structure illustrated in FIG. 2B, or have a structure where an axis of an opening of the first visibility supplementary layer 113a intersects an axis of an opening of the second visibility supplementary layer 113b. Accordingly, the conductive line 114 may have a lattice shape and may have a stripe structure.

The conductive line 114, as illustrated in FIG. 5C, may be sandwiched in order for even a side thereof to be surrounded by the first visibility supplementary layer 113a and the second visibility supplementary layer 113b, or may be sandwiched in order for the side to be exposed. A case where the conductive line 114 is sandwiched in order for the side to be exposed may correspond to a case where the conductive line 114, the first visibility supplementary layer 113a, and the second visibility supplementary layer 113b are patterned together. In this case, although not illustrated in FIG. 5C, the conductive line 114 may have a taper shape where the edge of the conductive line 114, the edge of the first visibility supplementary layer 113a, and the edge of the second visibility supplementary layer 113b have similar angles, the long with of the conductive line 114 matches a short width of the first visibility supplementary layer 113a, and the long with of the conductive line 114 matches a short width of the second visibility supplementary layer 113b.

Figure 5D:
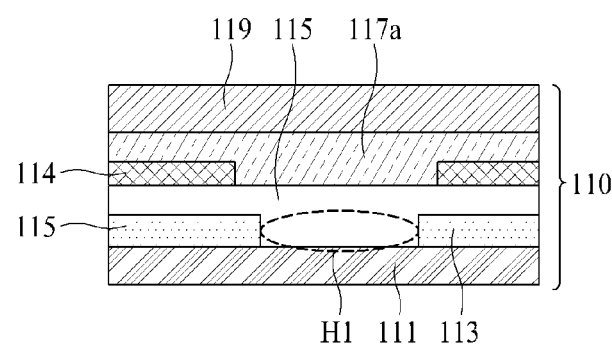

As illustrated in FIG. 5D, the conductive line 114 may be disposed between the planarization layer 115 and the insulation layer 117. In other words, the conductive line 114 may be disposed on the visibility supplementary layer 113. In more detail, the conductive line 114 and the planarization layer 115 may overlap each other without any element being disposed therebetween. Also, the conductive line 114 and the visibility supplementary layer 113 may overlap each other without being the planarization layer 115 therebetween. With respect to the plate 111, since the conductive line 114 is beneficially covered by the visibility supplementary layer 113, the width of the conductive line 114 may be equal to or less than that of the visibility supplementary layer 113. Here, the width of the visibility supplementary layer 113 denotes a distance between adjacent first holes H1.

As described above, the TFT array structure 110 according to an embodiment of the present invention may further include the conductive line 114 that is disposed between the visibility supplementary layer 113 and the TFT substrate 119 to overlap the visibility supplementary layer 113 and is electrically connected to the source electrode or drain electrode of the TFT included in the TFT array through a hole of the TFT substrate 119. The conductive line 114 may be electrically connected to the source electrode or the drain electrode and may be disposed to be spaced apart from another electrode and line for applying an electrical signal to the source electrode or the drain electrode. As a result, an interference may not occur between an electrical signal passing through the conductive line 114 and an electrical signal passing through the other electrode and line for applying the electrical signal to the source electrode or the drain electrode. The conductive line 114, which is electrically connected to the element of the TFT substrate 119 and is disposed to be spaced apart from the TFT substrate 119 due to the insulation layer 117 disposed under the TFT substrate 119, may be formed of metal or a metal alloy having a low resistance.

Hereinafter, an embodiment of a display apparatus including the TFT array structure 110 will be described in detail with reference to FIGS. 1 to 5D.

A display apparatus according to an embodiment of the present invention may include a light adjustment layer which is disposed on and driven by the TFT array structure 110, a black matrix which is disposed on the TFT array structure 110 and includes at least one hole disposed to overlap the first hole H1 of the visibility supplementary layer 113 in correspondence with the TFT array, and a light source which is disposed on the TFT array structure 110 and generates light energy output to the outside through the visibility supplementary layer 113.

With respect to the plate 111, other elements may be covered by the visibility supplementary layer 113. In this case, the other elements being covered by the visibility supplementary layer 113 denote that the other elements physically overlap each other and moreover are substantially not visually seen because the visibility supplementary layer 113 is opaque. The width of each of the plate 111 and the visibility supplementary layer 113 may be equal to or greater than those of the other elements. In this case, the width of the visibility supplementary layer 113 does not denote a distance between adjacent first holes H1 but denotes a whole width overlapping the plate 111.

In other words, the TFT array structure 110 may be the widest. A space, which is provided due to a difference between a size of the TFT array structure 110 and a size of each of the other elements, may be a space where the elements are physically fastened to and electrically connected to each other. Fastening and connection between all the elements may be made in a space covered by the TFT array structure 110, and thus, when a light image is output to the outside of the display apparatus through the plate 111, a user of the display apparatus may enjoy a screen including an edge which is smoothly trimmed.

In a case where a black matrix is disposed on the TFT array structure 110, the black matrix may be disposed in order for the TFT substrate 119 to be disposed between the visibility supplementary layer 113 and the black matrix. Also, the black matrix may include at least one hole corresponding to the TFT array, and thus, the hole of the black matrix may overlap the first hole H1 of the visibility supplementary layer 113. In other words, the black matrix may include the at least one hole which is disposed to overlap the first hole H1 in correspondence with the lattice shape of the visibility supplementary layer 113.

Similar to the visibility supplementary layer 113, the black matrix may block light by absorbing the light and includes a hole having a pierced shape, and thus, the black matrix may provide a traveling path of the light. Also, similar to the visibility supplementary layer 113, the black matrix may be formed of a material capable of being patterned by a photolithography process, and for example, may include a photosensitive material such as a photoinitiator. The material capable of being patterned by the photolithography process may include at least one of a black carbon pigment, a graphene oxide-based pigment, a graphite oxide-based pigment, a chromium-based pigment, a titanium-based pigment, and an organic color pigment, a binder polymer fixing a connection between pigments, a light cross-linking agent connecting pigments, and a photoinitiator and an additive for adding viscosity.

However, the black matrix may be formed after a high-temperature process of forming a TFT is performed, or may be formed in a separate process. Unlike the visibility supplementary layer 113 that beneficially maintains the shape and properties thereof under a high-temperature process of forming the TFT, the black matrix may use a polymer binder having a heat resistance lower than that of a polymer binder included in the visibility supplementary layer 113 (or the black matrix and the visibility supplementary layer 113 may respectively have polymer binders having an equal heat resistance). In other words, the polymer binder included in the black matrix may differ from the polymer binder included in the visibility supplementary layer 113, and a glass transition temperature of the polymer binder included in the visibility supplementary layer 113 may be higher than that of the polymer binder included in the black matrix. That is, the polymer binder of the black matrix may not use a siloxane-based binder, a silanzane-based binder, and a polyimide-based binder.

The light source may be disposed on the TFT array structure 110 so that a distance from the light source to the black matrix becomes shorter than a distance from the light source to the visibility supplementary layer 113. In other words, the light source may be disposed closer to the black matrix than the visibility supplementary layer 113.

In the display apparatus according to the embodiments of the present invention, physical fastening and electrical connection between the elements may be made in a rear portion instead of a side portion of the display apparatus, thereby considerably decreasing a bezel. In the display apparatus according to the embodiments of the present invention, since the TFT array structure 110 including the visibility supplementary layer 113 is disposed on a front surface of a screen, an external light is reduced or prevented from being reflected by the TFT substrate 119. Also, the visibility supplementary layer 113 may be disposed on the second area A2 of the plate 111 (e.g., a whole area including all edges of a screen), and thus, a light leakage is reduced or prevented from occurring in edges even without a physical blocking member being separately attached to each of edges of a screen.

Hereinafter, a display apparatus according to an embodiment of the present invention will be described in more detail with reference to FIGS. 6, 7A, 7B, 8A and 8B.

Figure 6:
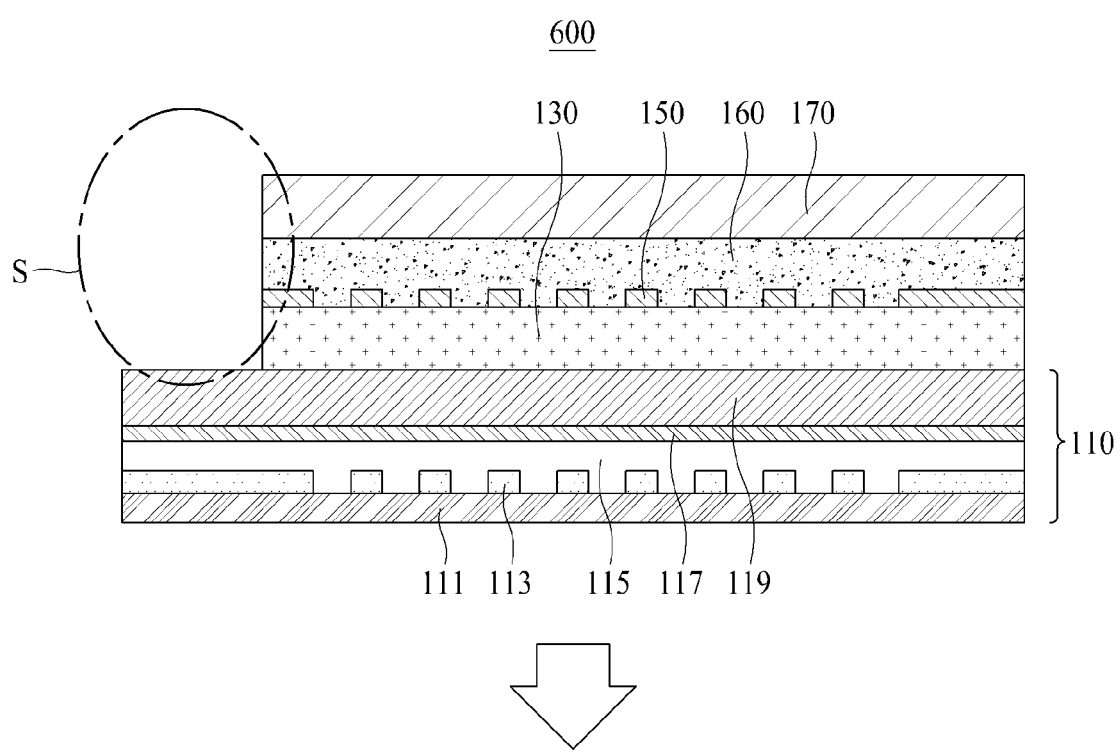
FIGS. 6, 7A, 7B, 8A and 8B are schematic cross-sectional views of a display apparatus according to an embodiment of the present invention including the TFT array structure according to an embodiment of the present invention.

FIG. 6 is a schematic cross-sectional view of a display apparatus 600 according to an embodiment of the present invention including the TFT array structure 110 according to an embodiment of the present invention.

Referring to FIG. 6, the display apparatus 600 according to an embodiment of the present invention may include a light energy adjustment layer 130 which is disposed on and driven by the TFT array structure 110, a black matrix 150 which is disposed on the light energy adjustment layer 130 and includes at least one hole disposed to overlap the first hole H1 of the visibility supplementary layer 113 in correspondence with the TFT array, a color filter layer 160 which is disposed on the black matrix 150, and a light source 170 which is disposed on the color filter layer 160 and generates light energy output to the outside through the visibility supplementary layer 113. An arrow indicates a light output direction.

With respect to the plate 111, other elements may be covered by the visibility supplementary layer 113. That is, a width of each of the plate 111 and the visibility supplementary layer 113 may be equal to or greater than those of the other elements. In this case, the width of the visibility supplementary layer 113 does not denote a distance between adjacent first holes H1 but denotes a whole width overlapping the plate 111. In other words, the TFT array structure 110 may be the widest. A space S, which is provided due to a difference between a size of the TFT array structure 110 and a size of each of the other elements, may be a space S where the elements are physically fastened to and electrically connected to each other. Fastening and connection between all the elements may be made in the space S covered by the TFT array structure 110. As a result, when a light image is output to an outside of the display apparatus through the plate 111, a user of the display apparatus may enjoy a screen including an edge which is smoothly trimmed.

The light energy adjustment layer 130 may be a liquid crystal layer. The liquid crystal layer may be driven by the TFT substrate 119 of the TFT array structure 110, and an alignment direction of liquid crystal may be adjusted according to the liquid crystal layer being driven by the TFT substrate 119, thereby adjusting the amount of light energy output to the outside. Accordingly, the liquid crystal layer may be driven by the TFT array structure 110 to adjust an amount of light energy which is generated by the light source 170 and output to the outside of the display apparatus.

In a case where the black matrix 150 is disposed on the TFT array structure 110, the black matrix 150 may be disposed in order for the TFT substrate 119 to be disposed between the visibility supplementary layer 113 and the black matrix 150. Also, the black matrix 150 may include at least one hole corresponding to the TFT array, and thus, a hole of the black matrix 150 may overlap the first hole H1 of the visibility supplementary layer 113. In other words, the black matrix 150 may include the at least one hole which is disposed to overlap the first hole H1 in correspondence with the lattice shape of the visibility supplementary layer 113.

The light source 170 may be disposed on the TFT array structure 110 so that a distance from the light source 170 to the black matrix 150 becomes shorter than a distance from the light source 170 to the visibility supplementary layer 113. In other words, the light source 170 may be disposed closer to the black matrix 150 than the visibility supplementary layer 113. In more detail, the light source 170 may be disposed on the TFT array structure 110, the light energy adjustment layer 130, and the color filter layer 160. Here, the light source 170 may be a backlight unit. The backlight unit may include a guide panel, an optical film, a light guide panel, a reflector film, and a light package.

As described above and illustrated in FIG. 6, the display apparatus 600 according to an embodiment of the present invention may be a liquid crystal display (LCD) apparatus where a light image is output to the outside through the TFT array structure 110 driving the liquid crystal, and other elements are covered by the visibility supplementary layer 113 disposed on a front surface. An aesthetic appearance and a degree of freedom in design of an LCD apparatus are enhanced, and a light leakage is prevented from occurring in edges.

Figure 7A:
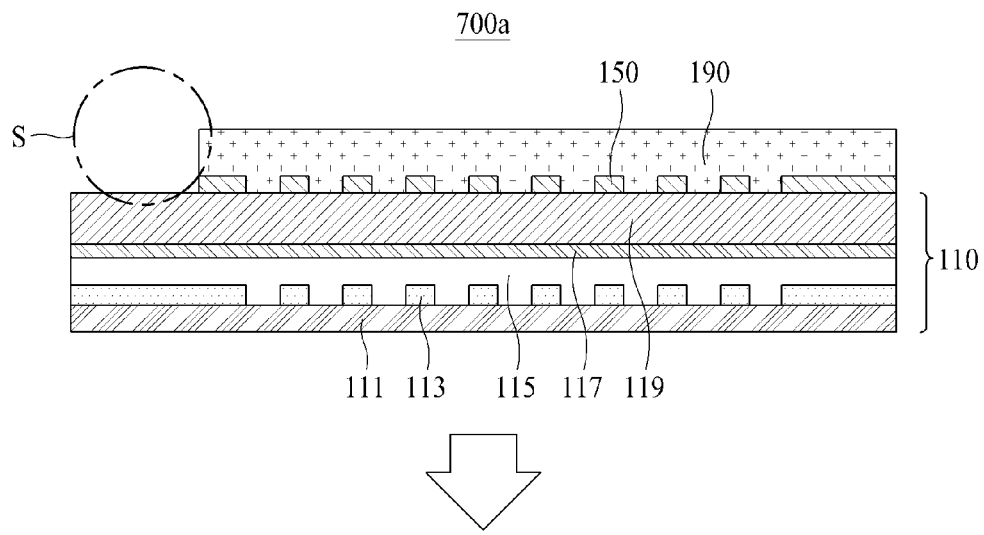
Figure 7B:
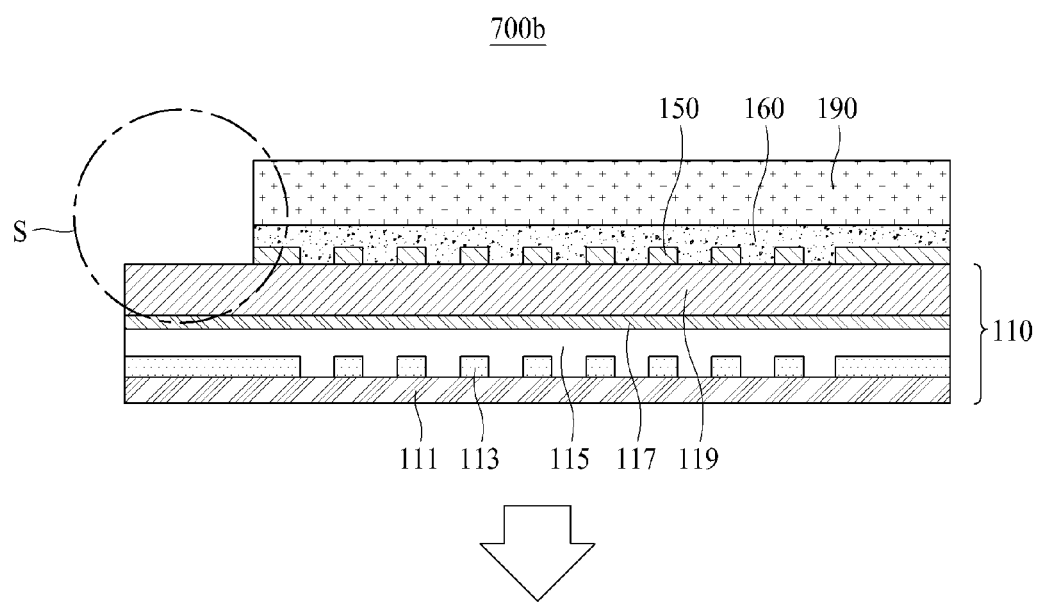

FIG. 7A is a schematic cross-sectional view of a display apparatus 700a according to an embodiment of the present invention including the TFT array structure 110 according to an embodiment of the present invention. FIG. 7B is a schematic cross-sectional view of a display apparatus 700b according to an embodiment of the present invention including the TFT array structure 110 according to an embodiment of the present invention.

Referring to FIG. 7A, the display apparatus 700a according to an embodiment of the present invention may include a light energy adjustment layer 190 which is disposed on and driven by the TFT array structure 110, a black matrix 150 which is disposed on the TFT array structure 110 and includes at least one hole disposed to overlap the first hole H1 of the visibility supplementary layer 113, and a light source 190 which is disposed on the black matrix 150 and generates light energy output to the outside through the visibility supplementary layer 113.

The light energy adjustment layer 190 may be the light source 190. The light source (the light energy adjustment layer) 190 may be disposed on the TFT array structure 110. Here, the light source 190 may be an organic light-emitting diode (OLED) layer 190. The OLED layer 190 may be configured by at least one OLED, and an area through which light emitted from the at least one organic light-emitting device is output may be defined as a pixel. Here, the at least one organic light-emitting device may include an anode, a cathode, and a multilayer (including, for example, a charge injection layer, a charge transport layer, an organic emission layer, etc.) disposed between the anode and the cathode.

The OLED layer 190 may be disposed on the TFT array structure 110 so that a distance from the OLED layer 190 to the black matrix 150 becomes shorter than a distance from the OLED layer 190 to the visibility supplementary layer 113. In other words, the OLED layer 190 may be disposed closer to the black matrix 150 than the visibility supplementary layer 113.

The OLED layer 190 may be driven by the TFT substrate 119 of the TFT array structure 110, and OLEDs of the OLED layer 190 may be turned on/off according to the OLED layer 190 being driven by the TFT substrate 119, thereby adjusting the amount of emitted light. In other words, the OLED layer 190 may act as the light source 190 generating light energy and may be driven by the TFT array structure 110 to adjust an amount of light output to an outside of the display apparatus by adjusting an amount of emitted light.

With respect to the plate 111, other elements may be covered by the visibility supplementary layer 113. That is, a width of each of the plate 111 and the visibility supplementary layer 113 may be equal to or greater than those of the other elements. In this case, the width of the visibility supplementary layer 113 does not denote a distance between adjacent first holes H1 but denotes a whole width overlapping the plate 111. In other words, the TFT array structure 110 may be the widest. A space S, which is provided due to a difference between a size of the TFT array structure 110 and a size of each of the other elements, may be a space S where the elements are physically fastened to and electrically connected to each other. Fastening and connection between all the elements may be made in the space S covered by the visibility supplementary layer 113. As a result, when a light image is output to an outside of the display apparatus through the plate 111, a user of the display apparatus may enjoy a screen including an edge which is smoothly trimmed.

The black matrix 150 may be disposed in order for the TFT substrate 119 to be disposed between the visibility supplementary layer 113 and the black matrix 150. Also, similar to the visibility supplementary layer 113, the black matrix 150 may include at least one hole corresponding to the TFT array. As a result, the hole of the black matrix 150 may overlap the first hole H1 of the visibility supplementary layer 113. In other words, the black matrix 150 may include the at least one hole which is disposed to overlap the first hole H1 in correspondence with the lattice shape of the visibility supplementary layer 113.

FIG. 7B illustrates an embodiment where a color filter layer 160 is further disposed between a black matrix and an OLED layer 190 in comparison with a structure according to the embodiment of FIG. 7A. As a result, when the light energy emitted from the OLED layer 190 has a white, each of a plurality of pixels may realize various colors due to the color filter layer 160. Alternatively, when the light energy emitted from each of OLEDs included in the OLED layer 190 has one of red, green, and blue, colors of the pixels are not mixed by the color filter layer 160, and the light energy is clearly output. Also, since the color filter layer 160 is further disposed, visibility of the display apparatus is enhanced without adding a separate polarizing member for preventing external light from being reflected. Except that the color filter layer 160 is further provided in comparison with the structure according to the embodiment of FIG. 7A, the embodiment of FIG. 7B is the same as the embodiment of FIG. 7A, and thus, a detailed description is omitted.

As described above and illustrated in FIGS. 7A and 7B, the display apparatus 700a (700b) according to an embodiment of the present invention may include the TFT substrate 119, disposed between the visibility supplementary layer 113 and the black matrix 150, and the OLED layer 190 driven by the TFT substrate 119. The display apparatus 700a (700b) according to an embodiment of the present invention may output light energy, generated by the OLED layer 190, to an outside of the display apparatus through the TFT array structure 110 which drives the OLEDs. The display apparatus 700a (700b) according to an embodiment of the present invention may be an organic light-emitting display apparatus where the visibility supplementary layer 113 is disposed on a front surface and other elements are covered by the visibility supplementary layer 113. Here, the OLED layer 190 may act as the light energy adjustment layer 190 or the light source 190.

In an organic light-emitting display apparatus that is the display apparatus 700a (700b) according to an embodiment of the present invention, an aesthetic appearance and a degree of freedom in design are enhanced, a light leakage can be reduced or prevented, and visibility can be prevented from being degraded due to a reflection of an external light. The organic light-emitting display apparatus that is the display apparatus 700a (700b) according to an embodiment of the present invention may be implemented thinner in thickness than an LCD apparatus which further includes a backlight unit.

Figure 8A:
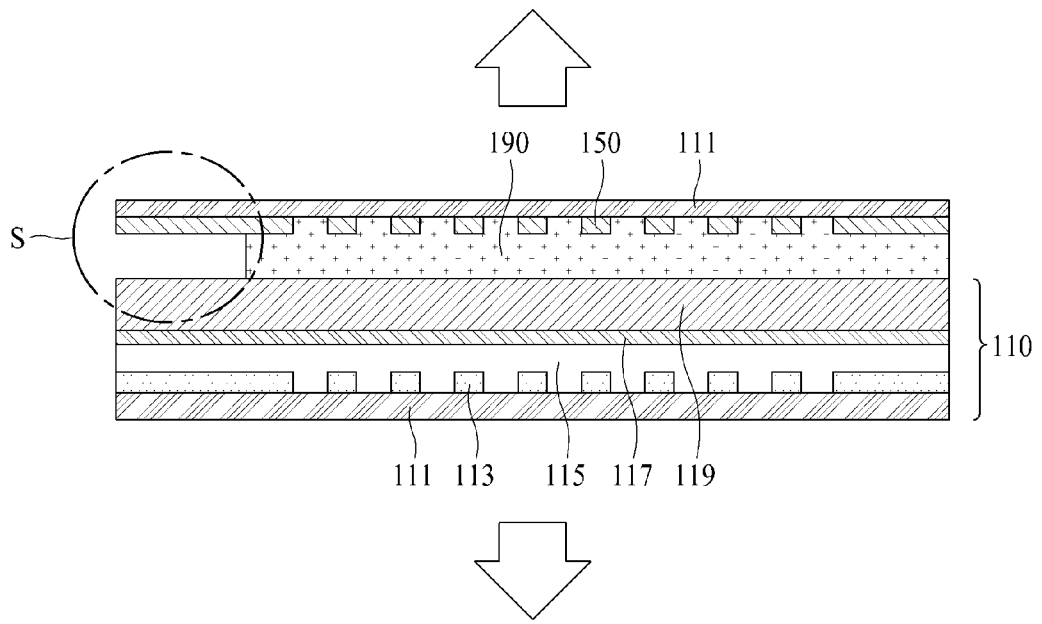
Figure 8B:
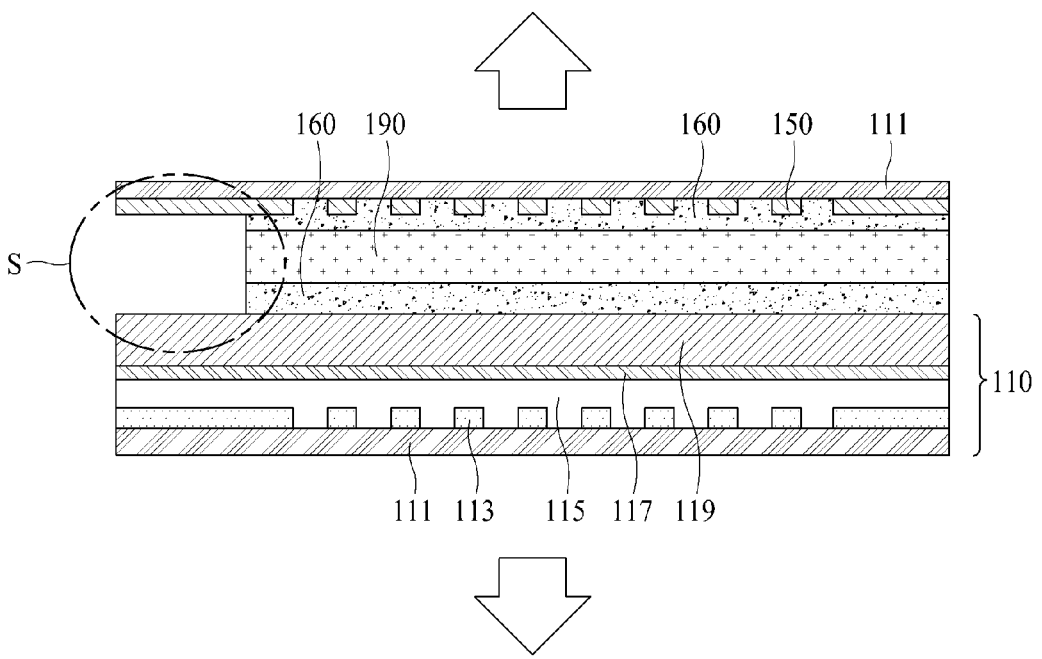

FIG. 8A is a schematic cross-sectional view of a display apparatus 800a according to an embodiment of the present invention including the TFT array structure 110 according to an embodiment of the present invention. FIG. 8B is a schematic cross-sectional view of a display apparatus 800b according to an embodiment of the present invention including the TFT array structure 110 according to an embodiment of the present invention.

Referring to FIG. 8A, the display apparatus 800a according to an embodiment of the present invention may include a light energy adjustment layer 190 which is disposed on and driven by the TFT array structure 110, a black matrix 150 which is disposed on the light energy adjustment layer 190 and includes at least one hole disposed to overlap the first hole H1 of the visibility supplementary layer 113, a plate 111 which is disposed on the black matrix 150, and a light source 190 which is disposed on the black matrix 150 and generates light energy output to the outside through the black matrix 150.

The light energy adjustment layer 190 may be the light source 190. The light source (the light energy adjustment layer) 190 may be disposed on the TFT array structure 110. Here, the light source 190 may be an OLED layer 190. The OLED layer 190 may be configured by at least one OLED, and an area through which light emitted from the at least one OLED is output may be defined as a pixel. Here, the at least one organic light-emitting device may include an anode, a cathode, and a multilayer (including, for example, a charge injection layer, a charge transport layer, an organic emission layer, etc.) disposed between the anode and the cathode.

The OLED layer 190 may be disposed on the TFT array structure 110 so that a distance from the OLED layer 190 to the black matrix 150 becomes shorter than a distance from the OLED layer 190 to the visibility supplementary layer 113. In other words, the OLED layer 190 may be disposed closer to the black matrix 150 than the visibility supplementary layer 113.

The OLED layer 190 may be driven by the TFT substrate 119 of the TFT array structure 110, and OLEDs of the OLED layer 190 may be turned on/off according to the OLED layer 190 being driven by the TFT substrate 119, thereby adjusting the amount of emitted light. In other words, the OLED layer 190 may act as the light source 190 generating light energy and may be driven by the TFT array structure 110 to adjust the amount of light output to the outside of the display apparatus by adjusting the amount of emitted light.

Referring to FIG. 8A, the display apparatus according to an embodiment of the present invention may output a light image in both directions. That is, an up direction as well as a down direction with respect to the OLED layer 190 in FIG. 8A may function as a screen of the display apparatus. In a case where a user looks at an up-direction screen of the display apparatus, in order to reduce or prevent degradation in visibility and light leakage, the black matrix 150 may be disposed on the OLED layer 190, and the plate 111 may be disposed on the black matrix 150. In this case, with respect to two the plates 111, other elements may be covered by the visibility supplementary layer 113 and the black matrix 150.

That is, a width of each of the plate 111, the visibility supplementary layer 113, and the black matrix 150 may be equal to or greater than those of the other elements. In this case, the width of the visibility supplementary layer 113 does not denote a distance between adjacent first holes H1 but denotes a whole width overlapping the plate 111.

The two plates 111 may be disposed to face each other with the OLED layer 190 therebetween, and the visibility supplementary layer 113 and the black matrix 150 may be disposed inward therefrom. As a result, a space S, which is provided due to a difference between a size of the TFT array structure 110 and a size of each of the other elements, may be a space S where the elements are physically fastened to and electrically connected to each other. Fastening and connection between all the elements may be made in the space S covered by the visibility supplementary layer 113 and the black matrix 150. As a result, when a light image is output to the outside in both directions of the display apparatus through the plates 111, a user of the display apparatus may enjoy a bidirectional screen including an edge which is smoothly trimmed.

The black matrix 150 may be disposed in order for the TFT substrate 119 to be disposed between the visibility supplementary layer 113 and the black matrix 150. Also, similar to the visibility supplementary layer 113, the black matrix 150 may include at least one hole corresponding to the TFT array. As a result, the hole of the black matrix 150 may overlap the first hole H1 of the visibility supplementary layer 113. In other words, the black matrix 150 may include the at least one hole which is disposed to overlap the first hole H1 in correspondence with the lattice shape of the visibility supplementary layer 113.

Also, the black matrix 150 may also have the same width as that of the visibility supplementary layer 113. Particularly, a width of the black matrix 150 may be equal to that of the visibility supplementary layer 113 in the second area A2 of the plate 111. In this case, the width of the visibility supplementary layer 113 does not denote a distance between adjacent first holes H1 but denotes a whole width overlapping the plate 111. As a result, the space S where the elements are fastened or connected to each other may be provided by the black matrix 150 and the visibility supplementary layer 113 in the second area A2 of the plate 111, and a light energy is reduced or prevented from being leaked from the space S to the outside. As a result, a physical blocking member is removed from all edges of a screen of the display apparatus, thereby providing an aesthetic factor such as there being substantially no bezel in the display apparatus.

FIG. 8B illustrates an embodiment where a color filter layer 160 is further disposed under and on an OLED layer 190 in comparison with a structure according to the embodiment of FIG. 8A. As a result, when the light energy emitted from the OLED layer 190 has a white, each of a plurality of pixels may realize various colors due to the color filter layer 160. Alternatively, when the light energy emitted from each of OLEDs included in the OLED layer 190 has one of red, green, and blue, colors of the pixels are not mixed by the color filter layer 160, and the light energy is clearly output. Also, since the color filter layer 160 is further disposed, visibility of the display apparatus is enhanced without adding a separate polarizing member for preventing external light from being reflected. Except that the color filter layer 160 is further provided in comparison with the structure according to the embodiment of FIG. 8A, the embodiment of FIG. 8B is the same as the embodiment of FIG. 8A, and thus, a detailed description is omitted.

As described above and illustrated in FIGS. 8A and 8B, the display apparatus 800a (800b) according to an embodiment of the present invention may include the TFT substrate 119, disposed between the visibility supplementary layer 113 and the black matrix 150, and the OLED layer 190 driven by the TFT substrate 119. The display apparatus 800a (800b) according to an embodiment of the present invention may output light energy, generated by the OLED layer 190, to one direction screen of the display apparatus through the TFT array structure 110 which drives the OLEDs, and may output the light energy to another direction screen of the display apparatus through the black matrix 150.

The display apparatus 800a (800b) according to an embodiment of the present invention may be an organic light-emitting display apparatus where the visibility supplementary layer 113 is disposed on a front surface thereof, the black matrix 150 is disposed on a rear surface thereof, and other elements are covered by the visibility supplementary layer 113 and the black matrix 150 in both directions. Here, the OLED layer 190 may act as the light energy adjustment layer 190 or the light source 190.

In an organic light-emitting display apparatus that is the display apparatus 800a (800b) according to an embodiment of the present invention, an aesthetic appearance and a degree of freedom of a design are enhanced, and light is prevented from being leaked. The organic light-emitting display apparatus that is the display apparatus 800a (800b) according to an embodiment of the present invention may be implemented thinner in thickness than an LCD apparatus which further includes a backlight unit. Also, the organic light-emitting display apparatus that is the display apparatus 800a (800b) according to an embodiment of the present invention may include one the light source 190 and may display a light image in both directions. In the organic light-emitting display apparatus that is the display apparatus 800a (800b) according to an embodiment of the present invention, the light image may be displayed in the both directions, and physical fastening and electrical connection between the elements may be made in a rear portion instead of a side portion of the display apparatus, thereby considerably decreasing a bezel.

A TFT array structure according to an embodiment of the present invention may include a plate having transparency, a TFT substrate facing the plate, and a visibility supplementary layer disposed between the TFT substrate and the plate in a structure covering a portion of the TFT substrate to prevent external light from being reflected by a line of the TFT substrate. In other words, the TFT array structure according to an embodiment of the present invention may include a plate having transparency, a TFT substrate facing the plate, and a visibility supplementary layer disposed between the TFT substrate and the plate, wherein reflection of light in a direction from a line of the TFT substrate to the plate does not occur in a portion of the TFT substrate overlapping the visibility supplementary layer.

In this case, in the TFT array structure according to an embodiment of the present invention, the visibility supplementary layer may include an organic material having characteristic necessary for a high temperature condition applied to a process of forming the TFT substrate. In other words, the visibility supplementary layer may include an organic material based on a process of forming the TFT substrate.

In this case, in the TFT array structure according to an embodiment of the present invention, the plate may include a first area and a second area surrounding the first area, and the TFT substrate may include a TFT array in the first area.

In this case, in the TFT array structure according to an embodiment of the present invention, the visibility supplementary layer may include at least one hole provided for alignment with an align mark of the TFT substrate in correspondence with the second area. In other words, the visibility supplementary layer may include at least one hole provided to be aligned with the align mark of the TFT substrate in correspondence with the second area.

In this case, in the TFT array structure according to an embodiment of the present invention, the TFT substrate may include at least one align mark, and the at least one hole may be disposed in a dotted-line shape along an edge of the align mark and intermittently and repeatedly exposes the align mark.

In this case, in the TFT array structure according to an embodiment of the present invention, the visibility supplementary layer may include at least one second hole based on a driving integrated circuit being attached to the TFT substrate (configured to check whether a circuit board is attached) in correspondence with the second area. In other words, the visibility supplementary layer may include at least one second hole configured to visually check whether a driving integrated circuit to be attached to the TFT substrate is attached to the TFT substrate, based on the second area.

In this case, in the TFT array structure according to an embodiment of the present invention, the visibility supplementary layer may include a non-photosensitive organic material.

In this case, in the TFT array structure according to an embodiment of the present invention, the visibility supplementary layer may include at least one of a siloxane-based binder, a silanzane-based binder, and a polyimide-based binder.

In this case, the TFT array structure may further include a conductive line disposed between the visibility supplementary layer and the TFT substrate to overlap the visibility supplementary layer, the conductive line including metal or a metal alloy.

In this case, in the TFT array structure according to an embodiment of the present invention, the conductive line may be electrically connected to a source electrode or a drain electrode of a TFT included in the TFT array.

In this case, in the TFT array structure according to an embodiment of the present invention, a width of the conductive line may be less than a width of the visibility supplementary layer, the conductive line may include a portion sandwiched by the visibility supplementary layer, and the sandwiched portion may correspond to a whole area of the conductive line or may be a repeated partial area of the conductive line.

A display apparatus according to an embodiment of the present invention may include the TFT array structure according to an embodiment of the present invention, a black matrix layer including at least one hole in correspondence with a lattice shape of the visibility supplementary layer, a light energy adjustment layer disposed between the visibility supplementary layer and the black matrix layer, the light energy adjustment layer being driven by the TFT array structure, and a light source emitting light output to an outside through the visibility supplementary layer, the light source being disposed for a distance from the light source to the black matrix layer to become shorter than a distance from the light source to the visibility supplementary layer.

In this case, in the display apparatus including the TFT array structure according to an embodiment of the present invention, with respect to the plate, the other elements may be covered by the visibility supplementary layer, a width of the TFT array structure may be greater than a width of each of the other elements, and a space may be provided based on a difference between a size of the TFT array structure and a size of each of the other elements, may be covered by the visibility supplementary layer, and may enable the TFT array structure to be physically fastened to and electrically connected to the other elements.

In this case, in the display apparatus including the TFT array structure according to an embodiment of the present invention, a glass transition temperature of a polymer binder included in the black matrix may be lower than a glass transition temperature of a polymer binder included in the visibility supplementary layer.

As described above, since the visibility supplementary layer included in the TFT array structure according to the embodiments of the present invention is disposed on a whole area including all edges of a screen, a light leakage can be reduced or prevented from occurring in edges even without a physical blocking member being separately attached to each of edges of a screen.

Moreover, in the TFT array structure according to the embodiments of the present invention, the visibility supplementary layer may be disposed on a front surface of a screen with respect to a plate, and thus, a blocking member which is conventionally disposed on an edge can be removed from the TFT array structure.

In a finished product including the TFT array structure according to the embodiments of the present invention, a front surface of the TFT array structure may be exposed to users, and thus, the finished product is more innovatively and freely designed.

In the TFT array structure according to the embodiments of the present invention, since the visibility supplementary layer includes a material which is excellent in heat resistance, the visibility supplementary layer prevents reflection of external light from various lines included in the TFT array, and moreover, the shape and properties of the visibility supplementary layer may not be deformed even after a process of forming a TFT substrate.

Since an indentation of a pad part is visually observed with respect to a plate due to the second hole included in the TFT array structure according to the embodiments of the present invention, whether a driving IC is attached to the pad part can be easily checked.

The align mark of the TFT substrate is effectively aligned by the second hole included in the TFT array structure according to the embodiments of the present invention, thereby decreasing a process margin.

Since a conductive line included in the TFT array structure according to the embodiments of the present invention is electrically connected to a source electrode or a drain electrode of a TFT included in the TFT array and is disposed to be spaced apart from another electrode and another line which apply an electrical signal to the source electrode or the drain electrode, an interference may not occur between an electrical signal passing through the conductive line and an electrical signal passing through the other electrode and line which apply the electrical signal to the source electrode or the drain electrode.

In the display apparatus according to the embodiments of the present invention, since the TFT array structure including the visibility supplementary layer is disposed on a front surface of a screen, an external light is reduced or prevented from being reflected by the TFT substrate.

In the display apparatus according to the embodiments of the present invention, physical fastening and electrical connection between the elements may be made in a rear portion instead of a side portion of the display apparatus, thereby considerably decreasing a bezel.

In more detail, fastening and connection between all the elements may be made in a space covered by the TFT array structure, and thus, when a light image is output to the outside of the display apparatus through a plate, a user of the display apparatus may enjoy a screen including an edge which is smoothly trimmed.

Since the display apparatus according to the embodiments of the present invention includes the TFT array structure according to the embodiments of the present invention, a blocking member which is conventionally attached to an edge of a screen for preventing a light leakage can be removed from the display apparatus. Moreover, since the display apparatus according to the embodiments of the present invention includes the TFT array structure according to the embodiments of the present invention, an edge of a screen can be more freely designed.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A thin film transistor (TFT) array structure comprising:
a plate having a transparency;
a TFT substrate facing the plate; and
a visibility supplementary layer between the TFT substrate and the plate in a structure covering a portion of the TFT substrate to reduce or prevent an external light from being reflected by a line of the TFT substrate,
wherein the plate comprises a first area and a second area surrounding the first area, and
wherein the TFT substrate comprises a TFT array in the first area.

2. The TFT array structure of claim 1, wherein the visibility supplementary layer comprises an organic material having a characteristic for a high temperature condition applied to a process of forming the TFT substrate.

3. The TFT array structure of claim 1, wherein the visibility supplementary layer comprises an organic material based on a process of forming the TFT substrate.

4. The TFT array structure of claim 1, wherein the visibility supplementary layer comprises at least one hole provided to be aligned with an align mark of the TFT substrate in correspondence with the second area.

5. The TFT array structure of claim 4, wherein
the TFT substrate comprises at least one align mark, and
the at least one hole is disposed in a dotted-line shape along an edge of the align mark and intermittently and repeatedly exposes the align mark.

6. The TFT array structure of claim 1, wherein the visibility supplementary layer comprises at least one second hole based on a driving integrated circuit being attached to the TFT substrate in correspondence with the second area.

7. The TFT array structure of claim 6, wherein
the TFT substrate comprises at least one pad part including an indentation, and
the at least one hole is disposed in a structure exposing the indentation.

8. The TFT array structure of claim 1, wherein the visibility supplementary layer comprises a non-photosensitive organic material.

9. The TFT array structure of claim 1, wherein the visibility supplementary layer comprises at least one of a siloxane-based binder, a silanzane-based binder, and a polyimide-based binder.

10. The TFT array structure of claim 1, further comprising: a conductive line disposed between the visibility supplementary layer and the TFT substrate to overlap the visibility supplementary layer, the conductive line including metal or a metal alloy.

11. The TFT array structure of claim 10, wherein the conductive line is electrically connected to a source electrode or a drain electrode of a TFT included in the TFT array.

12. The TFT array structure of claim 10, wherein
a width of the conductive line is less than a width of the visibility supplementary layer,
the conductive line comprises a portion sandwiched by the visibility supplementary layer, and
the sandwiched portion corresponds to a whole area of the conductive line or is a repeated partial area of the conductive line.

13. A display apparatus comprising:
the TFT array structure of claim 1;
a black matrix layer including at least one hole in correspondence with a lattice shape of the visibility supplementary layer;
a light energy adjustment layer between the visibility supplementary layer and the black matrix layer, the light energy adjustment layer being driven by the TFT array structure; and
a light source emitting light output to an outside through the visibility supplementary layer, the light source being disposed for a distance from the light source to the black matrix layer to become shorter than a distance from the light source to the visibility supplementary layer.

14. The display apparatus of claim 13, wherein
with respect to the plate, the other elements are covered by the visibility supplementary layer,
a width of the TFT array structure is greater than a width of each of the other elements, and
a space is provided based on a difference between a size of the TFT array structure and a size of each of the other elements, is covered by the visibility supplementary layer, and enables the TFT array structure to be physically fastened to and electrically connected to the other elements.

15. The display apparatus of claim 13, wherein a glass transition temperature of a polymer binder included in the black matrix is lower than a glass transition temperature of a polymer binder included in the visibility supplementary layer.

16. The display apparatus of claim 13, wherein the visibility supplementary layer comprises an organic material.

17. The display apparatus of claim 13, wherein the visibility supplementary layer comprises at least one hole provided to be aligned with an align mark of the TFT substrate in correspondence with the second area.

18. The display apparatus of claim 17, wherein
the TFT substrate comprises at least one align mark, and
the at least one hole is disposed in a dotted-line shape along an edge of the align mark and intermittently and repeatedly exposes the align mark.

19. The display apparatus of claim 13, wherein the visibility supplementary layer comprises at least one second hole based on a driving integrated circuit being attached to the TFT substrate in correspondence with the second area.

20. The display apparatus of claim 19, wherein
the TFT substrate comprises at least one pad part including an indentation, and
the at least one hole is disposed in a structure exposing the indentation.

21. The display apparatus of claim 13, wherein the TFT array structure further comprises a conductive line disposed between the visibility supplementary layer and the TFT substrate to overlap the visibility supplementary layer, the conductive line including metal or a metal alloy.

22. The display apparatus of claim 21, wherein the conductive line is electrically connected to a source electrode or a drain electrode of a TFT included in the TFT array.

23. The display apparatus of claim 21, wherein
a width of the conductive line is less than a width of the visibility supplementary layer,
the conductive line comprises a portion sandwiched by the visibility supplementary layer, and
the sandwiched portion corresponds to a whole area of the conductive line or is a repeated partial area of the conductive line.

* * * * *